(12) United States Patent
Nathan et al.

(10) Patent No.: US 7,248,236 B2
(45) Date of Patent: *Jul. 24, 2007

(54) ORGANIC LIGHT EMITTING DIODE DISPLAY HAVING SHIELD ELECTRODES

(75) Inventors: Arokia Nathan, Waterloo (CA); Peyman Servati, Waterloo (CA); Karim S. Karim, Kitchener (CA)

(73) Assignee: Ignis Innovation Inc., Waterloo, Ontario (CA)

( * ) Notice: Subject to any disclaimer, the term of this patent is extended or adjusted under 35 U.S.C. 154(b) by 337 days.

This patent is subject to a terminal disclaimer.

(21) Appl. No.: 10/468,320

(22) PCT Filed: Feb. 18, 2002

(86) PCT No.: PCT/CA02/00180

§ 371 (c)(1),
(2), (4) Date: Jan. 23, 2004

(87) PCT Pub. No.: WO02/067328

PCT Pub. Date: Aug. 29, 2002

(65) Prior Publication Data

US 2004/0130516 A1    Jul. 8, 2004

(51) Int. Cl.
*G09G 3/30* (2006.01)
*G09G 3/36* (2006.01)

(52) U.S. Cl. .............................. 345/76; 345/82; 345/92

(58) Field of Classification Search .................. 345/55, 345/76, 82, 92, 206; 257/40
See application file for complete search history.

(56) References Cited

U.S. PATENT DOCUMENTS 6,252,248 B1 * 6/2001 Sano et al. ..................... 257/59
6,373,453 B1 * 4/2002 Yudasaka ...................... 345/76

(Continued)

FOREIGN PATENT DOCUMENTS

| EP | 0 940 796 | 9/1999 |
| EP | 0 940 796 A1 | 9/1999 |
| EP | 1 028 471 | 8/2000 |

OTHER PUBLICATIONS

Nathan A et al: "Thin film imaging technology on glass and plastic" ICM 2000. Proceedings of the 12th International Conference on Microelectronics. (IEEE Cat. No. 00EX453), ICM 2000. Proceedings of the 12th International Conference on Microelectronics, Tehran, Iran, Oct. 31-Nov. 2, 2000, pp. 11-14, XP002206242, 2000, Tehran, Iran, Univ. Tehran, Iran ISBN: 964-360-057-2 p. 13, col. 1, line 11-48.

Patent Abstracts of Japan vol. 1997, No. 08, Aug. 29, 1997 - JP 09 090405 A (Sharp Corp), Apr. 4, 1997 abstract.

Patent Abstracts of Japan vol. 2000, No. 09, Oct. 13, 2000 - JP 2000 172199 A (Sanyo Electric Co Ltd), Jun. 23, 2000 abstract.

* cited by examiner

*Primary Examiner*—Dennis-Doon Chow
(74) *Attorney, Agent, or Firm*—Pearne & Gordon LLP

(57) ABSTRACT

An organic light emitting diode (OLED) display includes at least one shield electrode between a cathode layer and an OLED drive circuit. The OLED drive circuit has at least one thin-film transistor (TFT), and the shield electrode is disposed to correspond to the thin-film transistor and closer to the cathode layer, covering an entire region between the source and drain of the thin-film transistor. The shield electrode is either grounded or tied to the gate of the thin-film transistor, to thereby minimize parasitic capacitances in the pixels of the display to enhance the display performance. The presented architecture enables high density drive circuit integration in amorphous silicon or other technologies, yet preserving a high display aperture ratio.

12 Claims, 6 Drawing Sheets

ORGANIC LIGHT EMITTING DIODE DISPLAY HAVING SHIELD ELECTRODES

BACKGROUND OF THE INVENTION

1. Field of the Invention

The present invention relates to a display device, and more particularly to an organic light emitting diode display having shield electrodes.

2. Description of the Prior Art

The polymeric or organic light emitting diodes (OLEDS) are electroluminescent(EL) layers that emit light generated by radiative recombination of injected electrons and holes within one or more organic EL layers or an organic EL region thereof.

The OLED displays employing the OLED have been attracting more attention because of their various advantages including simple structures, fast response times and wide viewing angles.

FIG. 1A is a top view of a general active matrix OLED (AMOLED) display device. In FIG. 1A, a reference numeral 10 denotes an OLED display device. The OLED display device 10 has an OLED display 12, a gate multiplexer 16, and a driver 18. The OLED display 12 consists of a plurality of pixels 14 in a matrix array form for displaying images, for example. A reference numeral C denotes a portion of the OLED display 12 in store for enlargement of pixels FIG. 1B is a partially enlarged view of the OLED display of FIG. 1A, taken from the portion C of FIG. 1A. As shown in FIG. 1B, each of the pixels 14 has an OLED 22 and a thin-film (TFT) drive circuit 24. Address and data lines in FIG. 1B are connected to the gate multiplexer 16 and the driver 18, respectively, as shown in FIG. 1A.

FIG. 1C is a cross-sectioned view for one pixel, taken along lines A–A' of FIG. 1B, showing that the OLED 22 and the TFT drive circuit 24 are formed on a glass substrate 32.

The substrate 32 may be transparent or opaque. Thus, the OLED display may be configured to emit light through the substrate 32 or through the cathode layer. FIG. 1C shows such a pixel emitting light through the substrate 32.

In the OLED 22, the anode layer is typically made of a transparent conducting material, while the cathode layer is typically made of a conducting metal with a low work function.

The anode layer is formed as a transparent bottom electrode, while the cathode layer is formed as a continuous top electrode over the OLED layer.

In a general AMOLED display, it is important to ensure that the aperture ratio or fill factor, which is defined as the ratio of light emitting display area to the total pixel area, should be high enough to ensure display quality.

The AMOLED display 10 in FIG. 1A is based on light emission through an aperture on the glass substrate 32 where the backplane electronics is integrated. Increasing the on-pixel density of TFT integration for stable drive current reduces the size of the aperture. The same problem happens when pixel sizes are scaled down.

The solution to having an aperture ratio that is invariant on scaling or on-pixel integration density is to vertically stack the OLED layer on the backplane electronics or the TFT drive circuit, along with a transparent top electrode. FIG. 2 is a cross-sectioned view for a pixel formed with an OLED vertically stacked on the backplane electronics. In FIG. 2, a reference number 14 denotes the pixel. The pixel 14 has the OLED 31 and the backplane electronics 24 which are vertically stacked on the substrate 32. Reference numerals T1 and T2 denote thin-film transistors respectively. A more description of FIG. 2 can be found, later, when FIG. 3 is described.

The operations of the AMOLED display device 10 having the above structure will be described in detail with reference to FIGS. 1A–1D.

FIG. 1D is a view for showing an equivalent circuit of FIG. 1C. A 2-transistor driver circuit realized, for example, in polysilicon technology is illustrated for the equivalent circuit. The equivalent circuit can be applied to the AMLOED display as shown in FIG. 2 using amorphous silicon technology but with variation in TFT type and OLED location.

When a voltage Vaddress from the gate multiplexer 16 activates one of the address lines, a thin-film transistor T1 is turned on so that a voltage Vdata from the driver 18 starts charging a capacitor Cs through one of the data lines. At this time, the voltage Vdata also causes a gate capacitance of a driver thin-film transistor T2. Depending on the voltage Vdata on the data line, the capacitor Cs charges up to turn the driver transistor T2 on, which then starts conducting to drive the OLED 22 with an appropriate level of current. When the address line is turned off, the transistor T1 is turned off, and a voltage at the gate of the driver transistor T2 remains almost the same. Hence, the current through the OLED remains unchanged after the turn-off of the transistor T1. The current of the OLED changes only the next time around when a different voltage is written into the pixel.

However, the continuous back electrode can give rise to parasitic capacitance causing the leakage current of the transistor T1, whose effects can become significant enough to affect the operation of the driver transistor T2 when the continuous back electrode runs over the switching and other thin film transistors. That is, the presence of the continuous back electrode can induce a parasitic channel in thin-film transistors giving rise to high leakage current. The leakage current is the current that flows between the source and drain of the thin-film transistor T1 when the gate of the thin-film transistor T1 is in its OFF state.

The leakage current could drain away the charge on the gate of the driver thin-film transistor T2 by discharging the capacitance that keeps it continuously in its ON state. Accordingly, it adds to the total power consumption of the display.

SUMMARY OF THE INVENTION

It is an object of the present invention to provide a polymeric or organic light emitting diode(OLED) display having shield electrodes for minimizing parasitic capacitances to enhance the performance thereof.

It is another object of the present invention to provide an OLED display having shield electrodes for allowing surface emission through vertical pixel circuitry integration for a high aperture ratio.

The architecture enables high density drive circuit integration in amorphous silicon or other technologies, yet preserving the high aperture ratio.

In order to achieve the above objects, an OLED display according to the present invention comprises a substrate, and a plurality of pixels formed on the substrate and each having a unit for reducing parasitic capacitances causing leakage currents therein.

The parasitic capacitance reducing unit is formed with at least one shield electrode of electric conductor. Further, the pixels each include an OLED layer for emitting light; and a drive circuit for electrically driving the OLED layer, the at least one shield electrode being disposed between the OLED layer and the drive circuit.

Preferably, the OLED layer includes an anode layer, an electroluminescent layer, and a cathode layer, and the drive circuit has at least one thin-film transistor, the at least one shield electrode being disposed to correspond to the at least one thin-film transistor between the cathode layer and the at least one thin-film transistor. The at least one shield electrode covers an entire region between a source and a drain of the at least one thin-film transistor. Preferably, the at least one shield electrode is disposed closer to the cathode layer.

The OLED layer and the drive circuit may be vertically stacked over the substrate, the vertically stacked OLED layer and the drive circuit form a top emission, and the drive circuit may be formed in inverted staggered thin-film transistor structures. The at least one shield electrode is formed of Aluminium, Molybdenum, or a standard metallization layer in LCD process in a rectangular shape. The parasitic capacitance reducing unit is electrically grounded or tied to a gate of the at least one thin-film transistor.

The OLED display with the above structure according to the present invention minimizes parasitic capacitance in the drive circuit and leakage currents in the thin-film transistors by holding the voltage at the gate of the driver thin-film transistor.

Further, the OLED display according to the present invention allows the OLED layer to be vertically stacked on the backplane electronics, along with a transparent top electrode for the top or surface emission.

BRIEF DESCRIPTION OF THE DRAWINGS

The above objects and features of the present invention will become more apparent by describing in detail a preferred embodiments thereof with reference to the attached drawings, in which.

DETAILED DESCRIPTION OF THE PREFERRED EMBODIMENTS

Figure 1B:
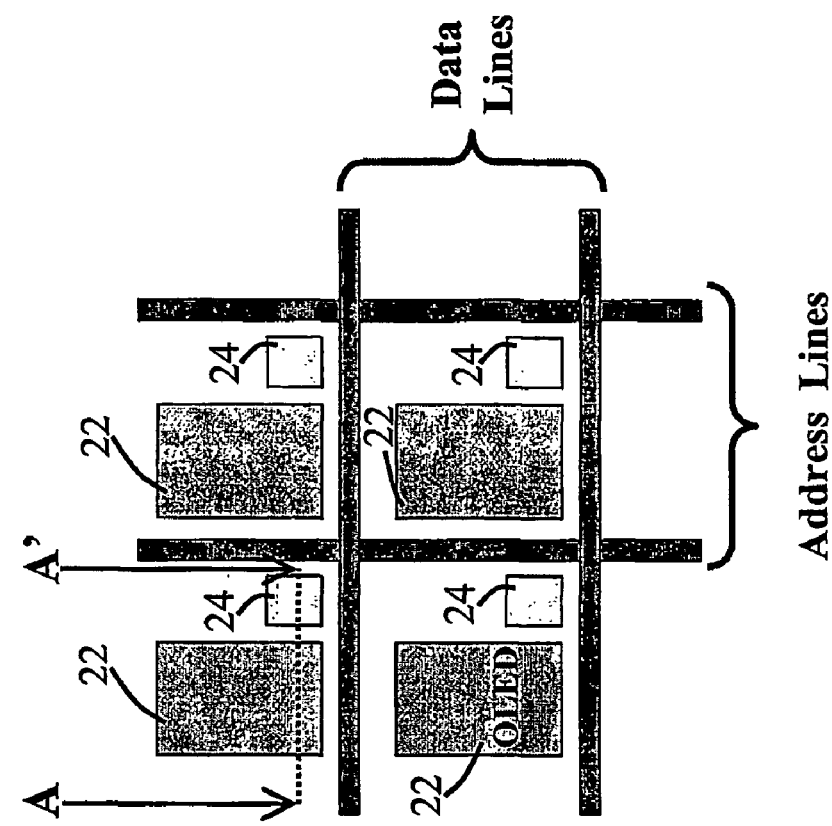
FIG. 1B is a partially enlarged view of the AMOLED display of FIG. 1A.
Figure 1A:
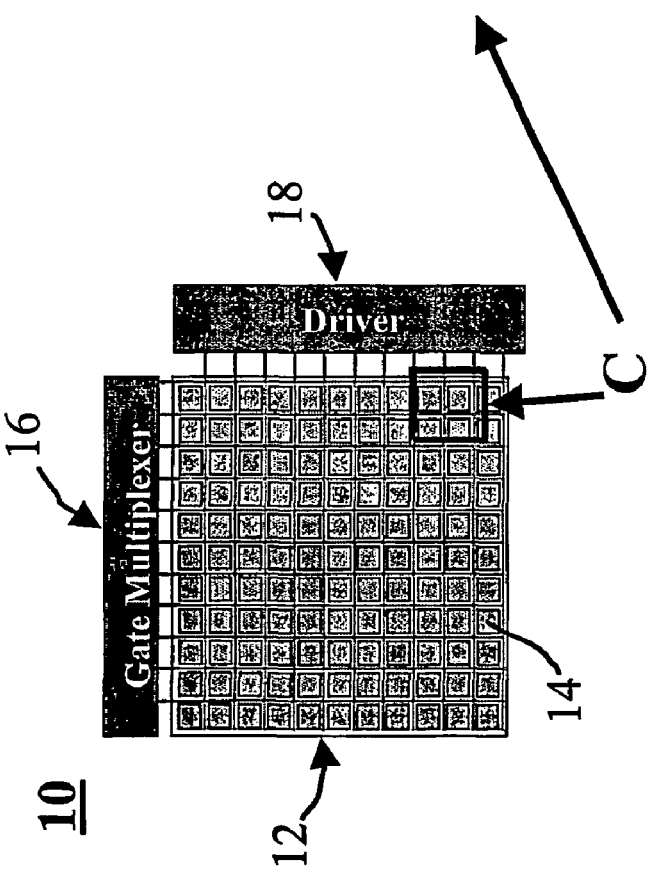
FIG. 1A is a top view of a general active matrix OLED (AMOLED) display with driving units.
Figure 1C:
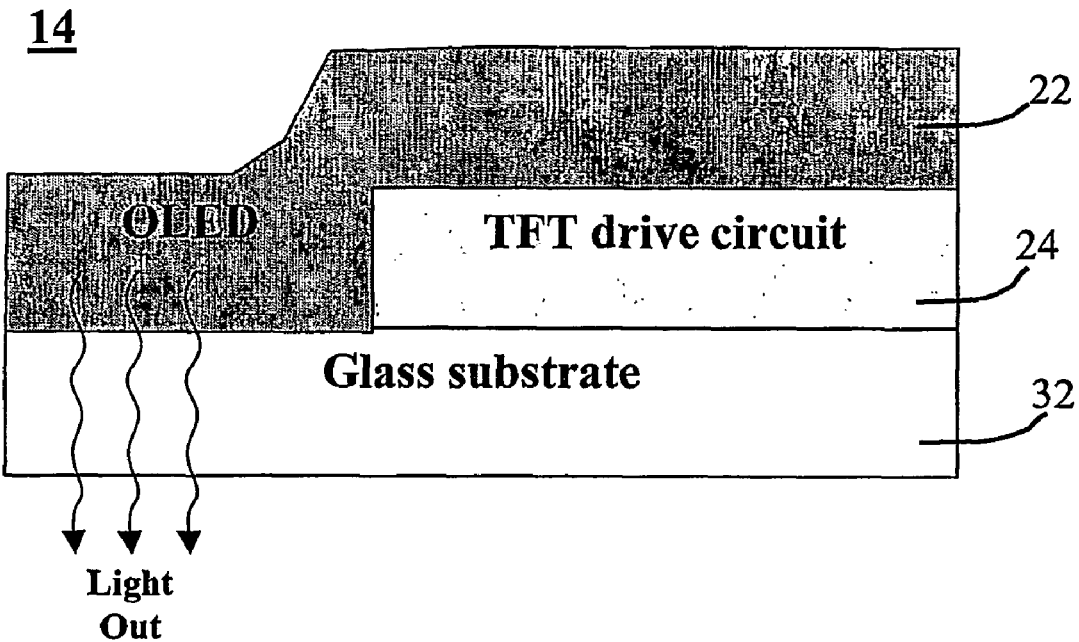
FIG. 1C is a cross-sectioned view for one pixel, taken along lines A–A' of FIG. 1B.

Hereinafter, descriptions will be made in detail on an organic light emitting diode display according to the embodiments of the present invention with reference to the accompanying drawings. Like reference numerals denotes like constituents throughout the disclosure.

Figure 3:
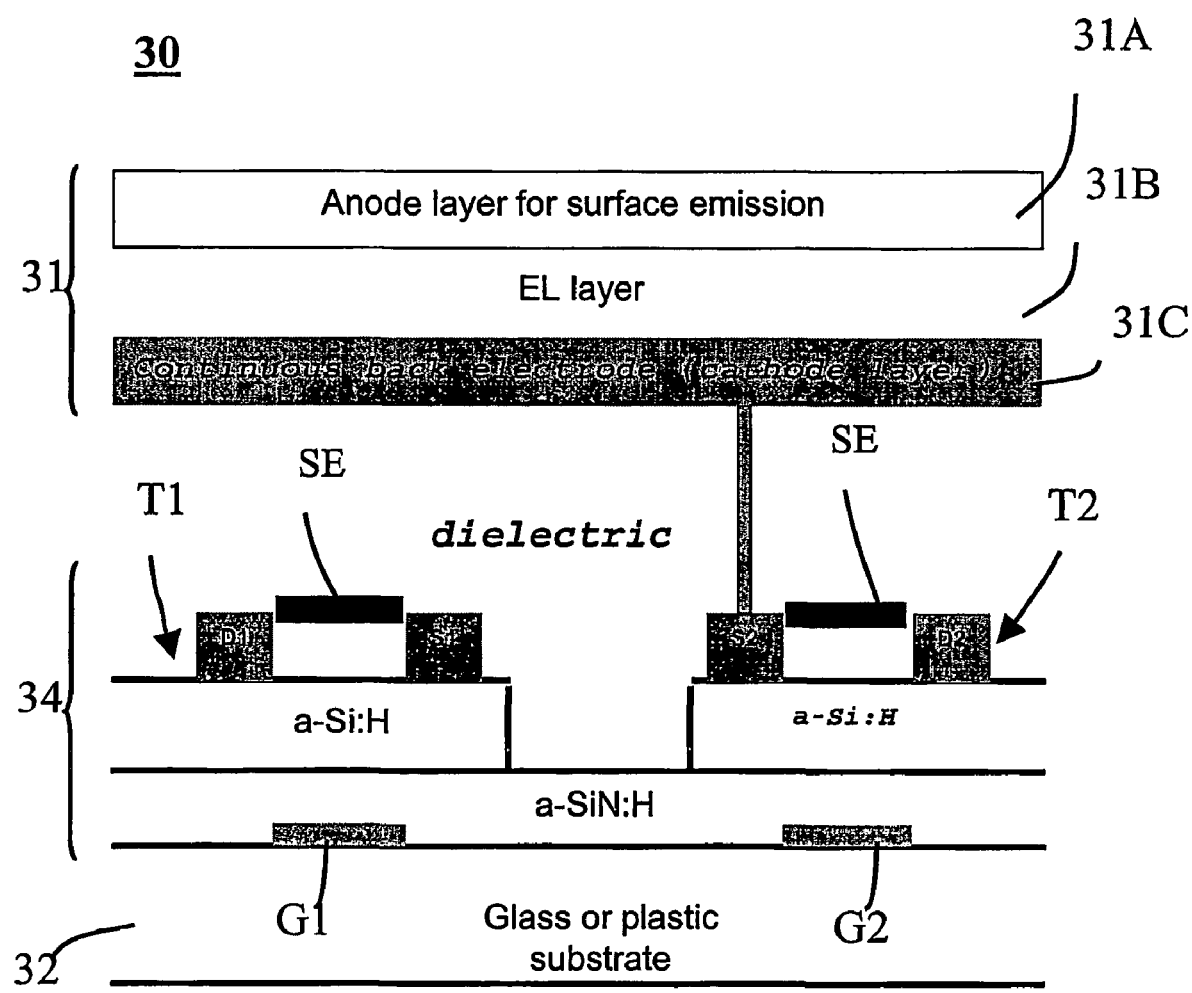
FIG. 3 is a cross-sectioned view for showing a pixel of an AMOLED display with shield electrodes formed over a drive circuit according to an embodiment of the present invention.

FIG. 3 is a cross-sectioned view for showing a pixel of an AMOLED display with shield electrodes formed over a drive circuit according to an embodiment of the present invention.

As stated above, the AMOLED display consists of a matrix array of pixels, but FIG. 3 shows only one pixel for the sake of simplicity in description.

As shown in FIG. 3, a pixel 30 includes an OLED layer 31, intermediate or shield electrodes SE, a drive circuit 34, and a substrate 32.

The OLED 31 has an anode electrode or an anode layer 31A, an EL layer 31B, and a cathode layer 31C. FIG. 3 shows the top or surface emission pixel. The cathode electrode 31C forms a continuous back electrode.

The drive circuit 34 consists of two thin-film transistors T1 and T2. The drive circuit 34 may be constructed with more than two thin-film transistors, and the pixel 30 may be structured with the OLED 31 vertically stacked over drive circuit 34 formed on the substrate 32. The drive circuit 34 can be formed with inverted staggered thin-film transistor structures. The a-Si:H and a-SiN:H denotes materials employed for the pixel 30. FIG. 3 also shows the pixel 30 has a dielectric layer between the cathode layer 31C and the drive circuit 34.

The TFT transistor T1 has a source S1, a drain D1, and a gate G1, and the TFT transistor T2 consists of a source S2, a drain D2, and a gate G2. In FIG. 3, the source S2 of the thin-film transistor T2 is electrically connected to the cathode layer 31C.

The substrate 32 may be made of glass, plastic, or semiconductor wafer which is known to one skilled in the art.

The shield electrodes SE are disposed between the OLED 31 and the drive circuit 34. The shield electrodes SE are preferably located closer to the continuous back electrode 31C.

Shield electrodes SE may be formed of Aluminium or Molybdenum, and a standard metallization layer in the LCD process may be formed for the shield electrodes SE.

The shield electrodes SE are formed, for example, in a rectangular shape, and should cover the entire region between the source and drain of each of the thin-film transistors T1 and T2. The shield electrodes SE are electrically either grounded or tied to the gates of the thin-film transistors T1 and T2, respectively.

Figure 4:
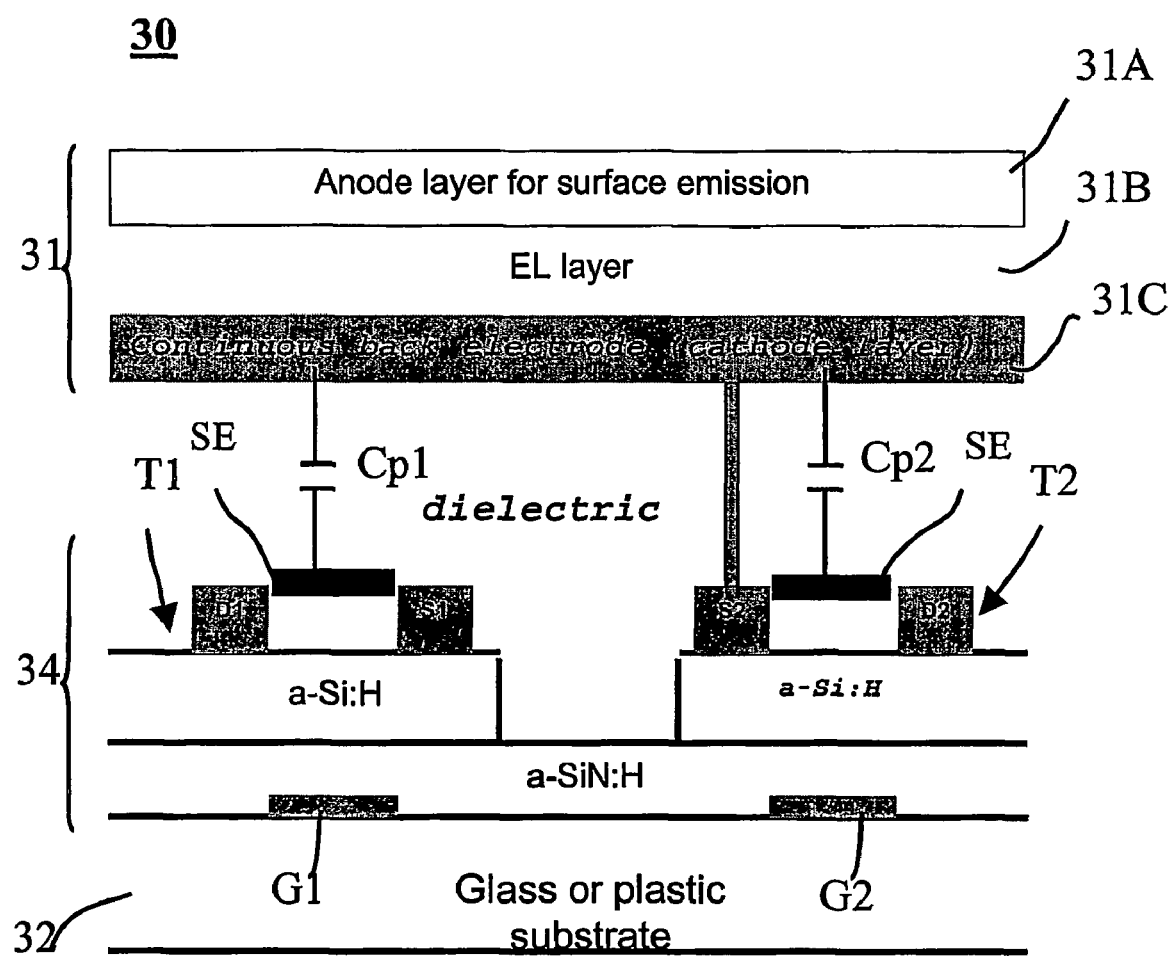
FIG. 4 is a view for showing the pixel of FIG. 3 with parasitic capacitance induced during operation thereof.

FIG. 4 is a view for showing the pixel of FIG. 3 with parasitic capacitances Cp1 and Cp2 induced during operation thereof.

Figure 5:
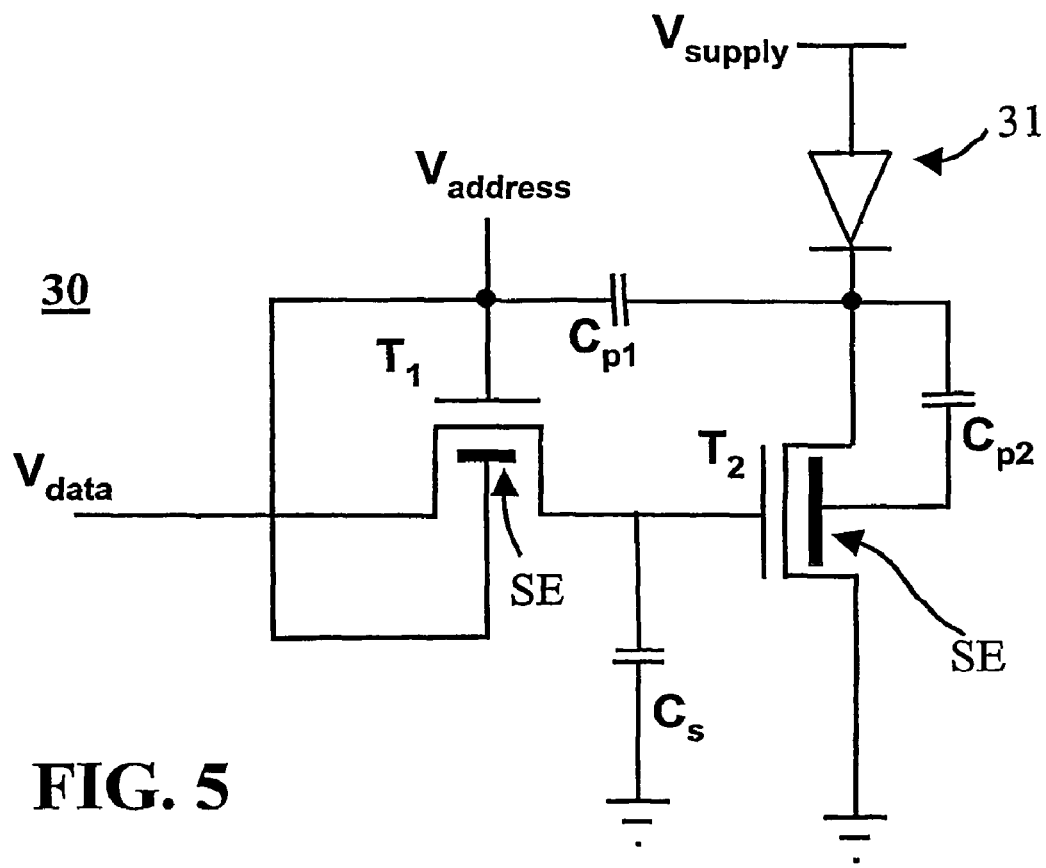
FIG. 5 is a view for showing a first equivalent circuit of FIG. 4.

FIG. 5 is a view for showing a first equivalent circuit of FIG. 4, in which the shield electrodes SE are electrically tied to the gates of the driver TFT transistors T1 and T2, respectively.

Figure 6:
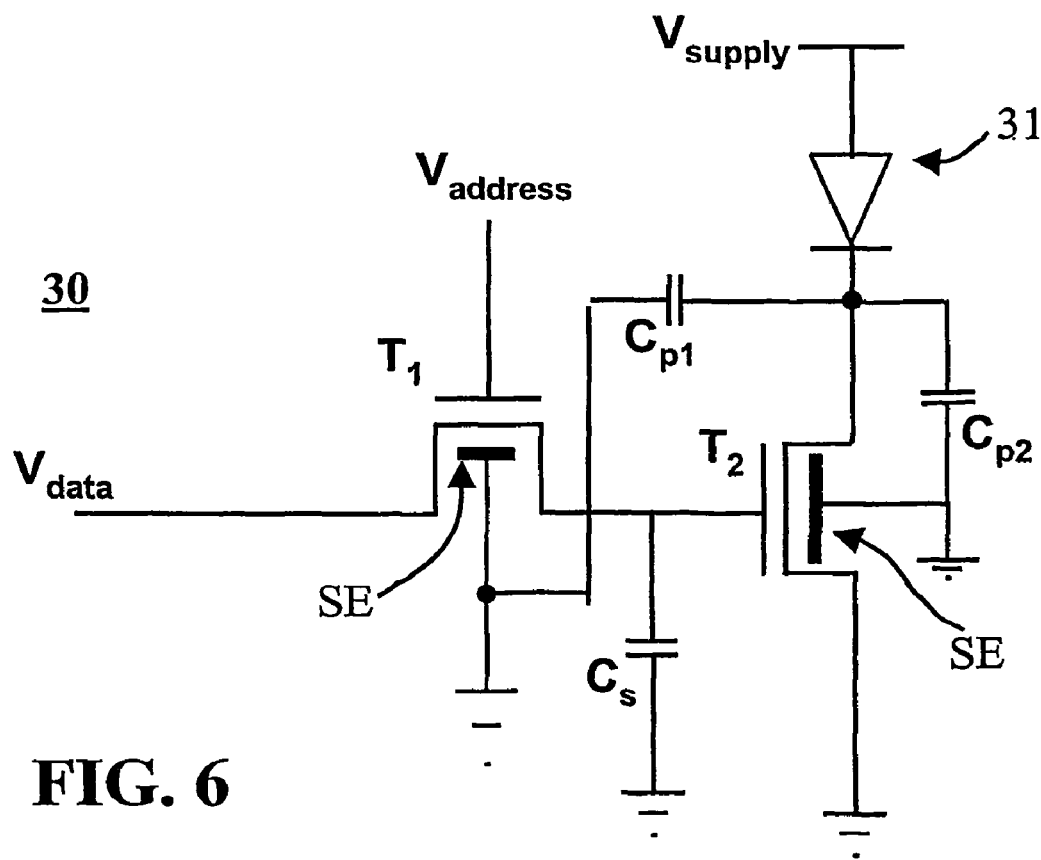
FIG. 6 is a view for showing a second equivalent circuit of FIG. 4.

FIG. 6 is a view for showing a second equivalent circuit of FIG. 4, in which the shield electrodes SE are electrically grounded.

FIGS. 4, 5, and 6 show that, during the operations of the pixel 30, the parasitic capacitances Cp1 and Cp2 are induced between the continuous back electrode 31C and the shield electrodes SE.

Figure 1D:
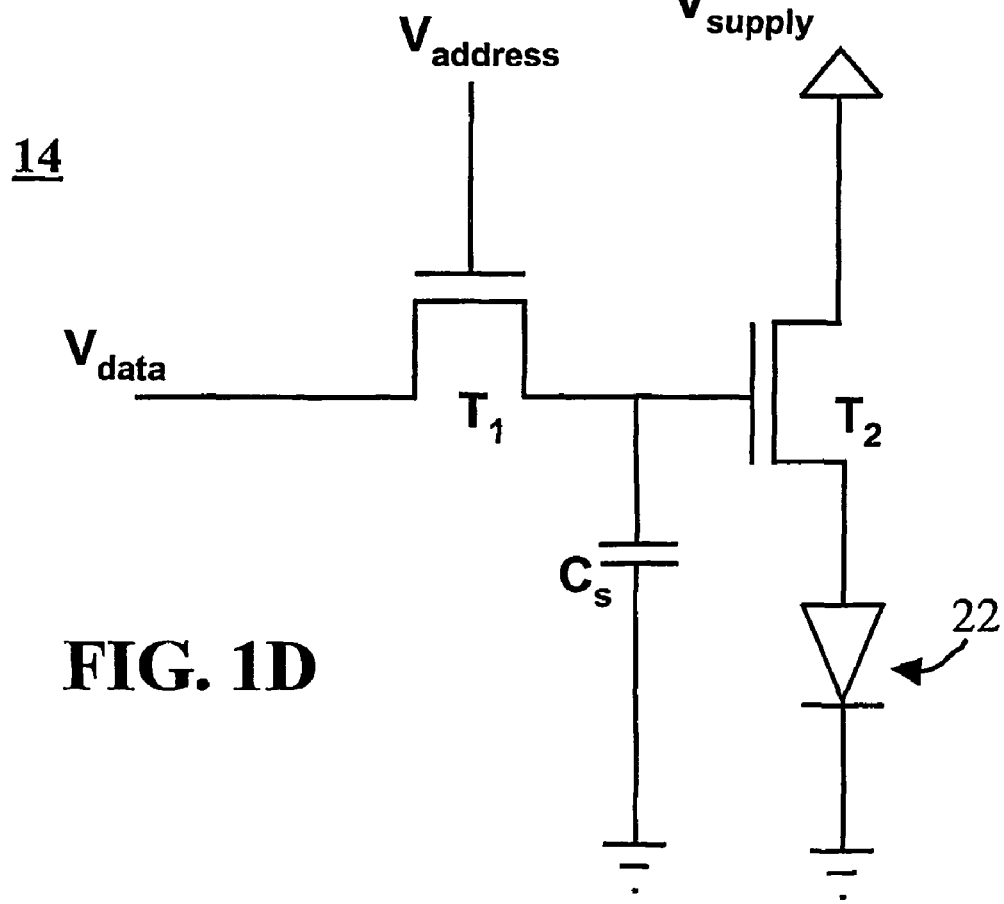
FIG. 1D is a view for showing an equivalent circuit of FIG. 1C.
Figure 2:
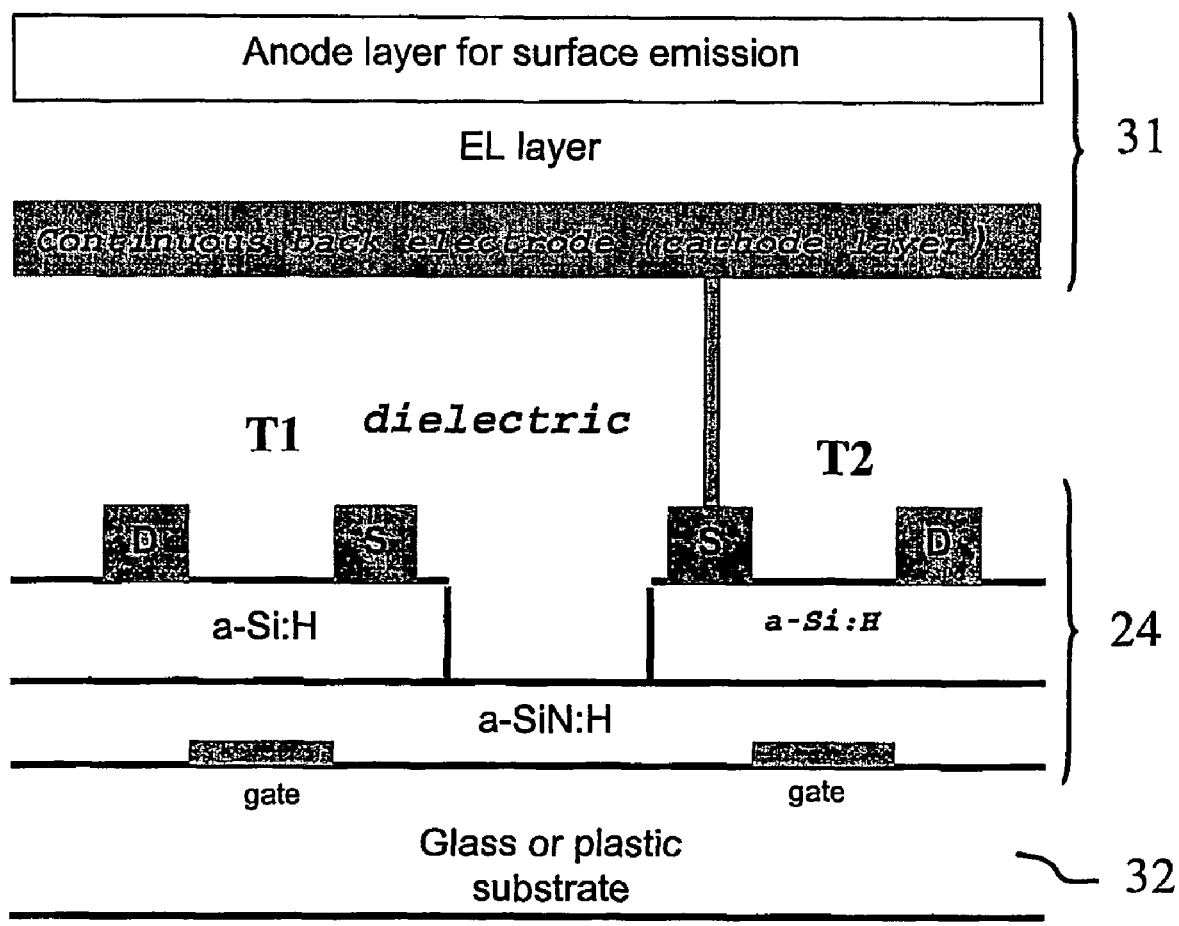
FIG. 2 is a cross-sectioned view for a pixel formed with an OLED vertically stacked on backplane electronics.

The operations of the pixel having the shield electrodes SE as shown in FIGS. 4, 5, and 6 are still the same as those of FIG. 1D, even though the shield electrodes SE are electrically connected to either ground or the gates of the thin-film transistors respectively. That is, when a voltage Vaddress from the gate multiplexer 16 activates one of the address lines, a thin-film transistor T1 is turned on so that a voltage Vdata from the driver 18 starts charging a capacitor Cs through one of the data lines. At this time, the voltage Vdata also causes a gate capacitance of a driver thin-film transistor T2. Depending on the voltage Vdata on the data line, the capacitor Cs charges up to turn the driver transistor T2 on, which then starts conducting to drive the OLED 22 with an appropriate level of current. When the address line is turned off, the transistor T1 is turned off, and a voltage at the gate of the driver transistor T2 remains almost the same. Hence, the current through the OLED remains unchanged after the turn-off of the transistor T1. The current of the OLED changes only the next time around when a different voltage is written into the pixel. At this time, the continuous back electrode can give rise to parasitic capacitance causing the leakage current of the transistor T1. In order to minimize the effect of the parasitic capacitance, the shield electrodes SE are introduced. That is during the above operation the shield electrodes SE shield electric potentials from propagating through to the thin-film transistors T1 and T2, hence preventing electric charges from being induced in the undesired regions of the pixel 30, and the parasitic capacitances Cp1 and Cp2 caused by the shield electrodes SE serve to stabilize the OLED operations by holding the voltage at the cathode steady.

Although the preferred embodiments of the present invention have been described, it will be understood by those skilled in the art that the present invention should not be limited to the described preferred embodiments, but various changes and modifications can be made within the spirit and scope of the present invention as defined by the appended claims.

What is claimed is:

1. An organic light emitting diode(OLED) display, comprising:
    a substrate; and
    a plurality of pixels formed on the substrate, each pixel of said plurality of pixels comprising:
        an OLED;
        a drive circuit for driving the OLED, the OLED being vertically stacked over the drive circuit, the drive circuit being vertically stacked over the substrate, the drive circuit including at least one thin-film transistor; and
        at least one shield electrode for reducing parasitic capacitances causing leakage currents, said shield electrode being disposed between the OLED and the drive circuit, the at least one shield electrode made from an electric conductor and arranged to cover an entire region between a source and a drain of the at least one thin-film transistor.

2. The OLED display as claimed in claim 1, wherein the at least one shield electrode is grounded.

3. The OLED display as claimed in claim 1, wherein the OLED comprises:
    a first electrode layer;
    a second electrode layer; and
    an electroluminescent layer between the first electrode layer and the second electrode layer,
    the at least one shield electrode being disposed to correspond to the at least one thin-film transistor between the second electrode layer and the at least one thin-film transistor.

4. The OLED display as claimed in claim 3, wherein the at least one thin-film transistor comprises a gate and wherein the at least one shield electrode is electrically tied to the gate.

5. The OLED display as claimed in claim 3, wherein the at least one shield electrode is disposed closer to the second electrode layer.

6. The OLED display as claimed in claim 5, wherein the pixels are each formed for a top emission in which light is directed away from the substrate.

7. The OLED display as claimed in claim 6, wherein the drive circuit is formed in inverted staggered thin-film structures.

8. The OLED display as claimed in claim 7, wherein the at least one shield electrode is formed of a standard metallization layer in LCD process or any other metallization.

9. The OLED display as claimed in claim 7, wherein the at least one shield electrode is formed in a rectangular shape.

10. The OLED display as claimed in claim 1, wherein the at least one shield electrode is formed of aluminium, molybdenum, a standard metallization layer in LCD process or any other metallization.

11. The OLED display as claimed in claim 1, wherein the drive circuit is formed in amorphous, poly, p-type, CMOS, microcrystalline, nanocrystalline, crystalline silicon or combinations thereof.

12. The OLED display as claimed in claim 1, wherein the pixels are each formed for a bottom emission in which light is directed through the substrate.

* * * * *